(12) United States Patent
Sharma

(10) Patent No.: US 6,977,839 B2
(45) Date of Patent: Dec. 20, 2005

(54) MAGNETIC MEMORY STORAGE DEVICE

(75) Inventor: Manish Sharma, Mountain View, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 0 days.

(21) Appl. No.: 11/064,883

(22) Filed: Feb. 23, 2005

(65) Prior Publication Data

US 2005/0139883 A1 Jun. 30, 2005

Related U.S. Application Data

(62) Division of application No. 10/460,816, filed on Jun. 12, 2003, now Pat. No. 6,885,582.

(51) Int. Cl.[7] .................. G11C 11/15; G11C 11/00; G11C 7/02; G11C 5/08
(52) U.S. Cl. .................. 365/173; 365/55; 365/66; 365/157; 365/158; 365/171
(58) Field of Search ............ 365/158, 171, 365/173, 211, 48, 55, 66, 97, 157

(56) References Cited

U.S. PATENT DOCUMENTS

| | | | | |
|---|---|---|---|---|
| 5,461,605 A | * | 10/1995 | Takimoto et al. | 369/126 |
| 5,560,097 A | * | 10/1996 | Bajhorek et al. | 29/603.12 |
| 5,812,516 A | * | 9/1998 | Nose et al. | 369/126 |
| 6,657,431 B2 | * | 12/2003 | Xiao | 324/244 |
| 6,825,052 B2 | * | 11/2004 | Eldridge et al. | 438/15 |
| 2002/0171969 A1 | * | 11/2002 | Leigh et al. | 360/77.03 |
| 2003/0214742 A1 | * | 11/2003 | Kai et al. | 360/46 |
| 2004/0051522 A1 | * | 3/2004 | Worledge et al. | 324/230 |
| 2004/0207396 A1 | * | 10/2004 | Xiao | 324/244 |
| 2004/0245547 A1 | * | 12/2004 | Stipe | 257/200 |
| 2005/0036225 A1 | * | 2/2005 | Kal et al. | 360/59 |

* cited by examiner

Primary Examiner—Huan Hoang
Assistant Examiner—Ly Duy Pham

(57) ABSTRACT

This invention provides a probe based magnetic memory storage device. In a particular embodiment, magnetic memory cells are provided in an array. Each cell provides a magnetic data layer and a conductor. At least one movable probe having a tip characterized by a conductor and a soft reference layer is also provided. In addition, an intermediate layer joined to either the movable probe or each memory cell is provided. The movable probe may be placed in contact with a given memory cell, the probe and cell thereby forming a tunnel junction memory cell with the intermediate layer serving as the tunnel junction. The magnetic field provided by the probe conductor may be combined with a field provided by the cell conductor to produce a switching field to alter the orientation of the data layer. The memory cells may include a material wherein the coercivity is decreased upon an increase in temperature. The probe may also include a heat generator. The magnetic field provided by the probe connector will not alter the orientation of an unheated cell, but may alter the orientation of a heated cell.

23 Claims, 6 Drawing Sheets

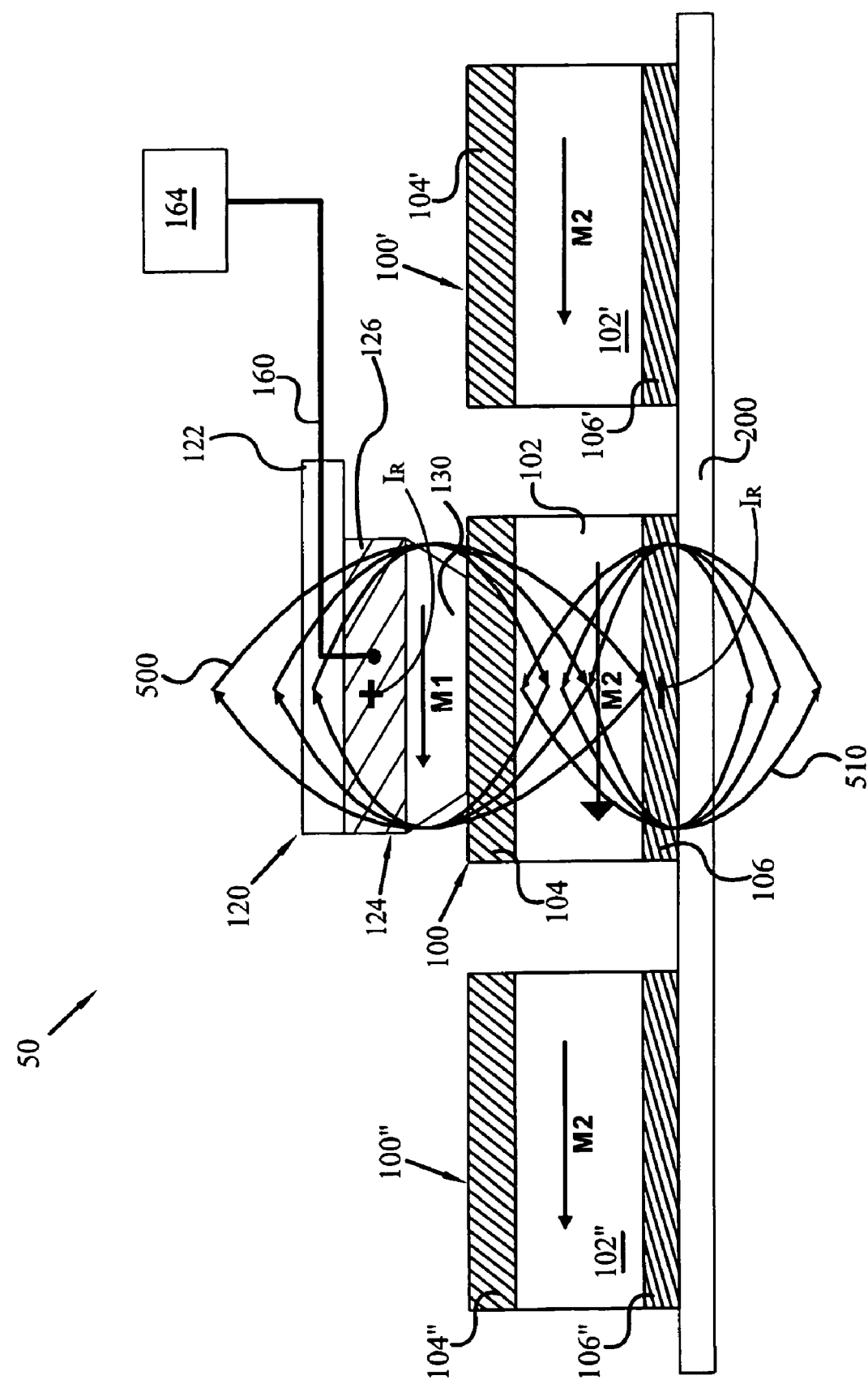

MAGNETIC MEMORY STORAGE DEVICE

This is a divisional of application Ser. No. 10/460,816, filed on Jun. 12, 2003, now U.S. Pat. No. 6,885,582, which is hereby incorporated by reference herein.

FIELD OF THE INVENTION

This invention relates generally to ultra-high density thermally assisted magnetic memory devices, and in particular to nanotip probe based magnetic memory arrays.

BACKGROUND OF THE INVENTION

Today's computer systems are becoming increasingly sophisticated, permitting users to perform an ever increasing variety of computing tasks at faster and faster rates. The size of the memory and the speed at which it can be accessed bear heavily upon the overall speed of the computer system.

Memory for a computer system is technically any form of electronic, magnetic or optical storage; however it is generally divided up into different categories based in part upon speed and functionality. The two general categories of computer memory are main memory and mass storage. Main memory is generally comprised of fast, expensive volatile random access memory that is connected directly to the processor by a memory buss.

Mass storage devices are typically permanent non-volatile memory stores which are understood to be less expensive, slow, large capacity devices such as bard drives, tape drives, optical media, and other mass storage devices. The primary objective of mass storage devices is to store an application or data until it is required for execution in main memory. In contrast to the main memory stores that may operate with access times of less than 100 nanoseconds, these mass storage devices operate with access times generally in excess of 1 millisecond.

Generally, the principle underlying the storage of data in a magnetic media (main or mass storage) is the ability to change, and or reverse, the relative orientation of the magnetization of a storage data bit (i.e the logic state of a "0" or a "1"). The coercivity of a material is the level of demagnetizing force that must be applied to a magnetic particle to reduce and or reverse the magnetization of the particle. Generally speaking, the smaller the magnetic particle the higher it's coercivity.

A prior art magnetic memory cell may be a tunneling magnetoresistance memory cell (TMR), a giant magnetoresistance memory cell (GMR), or a colossal magnetoresistance memory cell (CMR), each of which generally includes a data layer (also called a storage layer or bit layer), a reference layer, and an intermediate layer between the data layer and the reference layer. The data layer, the reference layer, and the intermediate layer can be made from one or more layers of material.

The data layer is usually a layer of magnetic material that stores a bit of data as an orientation of magnetization that may be altered in response to the application of external magnetic fields. More specifically, the orientation of magnetization of the data layer representing the logic state can be rotated (switched) from a first orientation representing a logic state of "0" to a second orientation, representing a logic state of "1", and/or vice versa. Generally speaking, the magnetic field used to accomplish the switch in orientation is known as a "coercive switching field," or even more simply as a "switching field."

The reference layer is usually a layer of magnetic material in which an orientation of magnetization is "pinned", as in fixed, in a predetermined direction. Often several layers of magnetic material are required and function as one to effectuate a stable pinned reference layer. The predetermined direction is determined and established by microelectronic processing steps employed in the fabrication of the magnetic memory cell.

Typically, the logic state (a "0" or a "1") of a magnetic memory cell depends on the relative orientations of magnetization in the data layer and the reference layer. For example, when an electrical potential bias is applied across the data layer and the reference layer in a TMR cell (also known as a tunnel junction memory cell), electrons migrate between the data layer and the reference layer through the intermediate layer. The intermediate layer is typically a thin dielectric layer commonly referred to as a tunnel barrier layer. The phenomena that cause the migration of electrons through the barrier layer may be referred to as quantum mechanical tunneling or spin tunneling. The logic state may be determined by measuring the resistance of the memory cell. For example, if the overall orientation of the magnetization in the data storage layer is parallel to the pinned orientation of magnetization in the reference layer the magnetic memory cell will be in a state of low resistance. If the overall orientation of the magnetization in the data storage layer is anti-parallel (opposite) to the pinned orientation of magnetization in the reference layer the magnetic memory cell will be in a state of high resistance.

In an ideal setting the orientation of the alterable magnetic field in the data layer would be either parallel or anti-parallel with respect to the field of the reference layer. As both the data layer and the reference layer are generally both made from ferromagnetic materials and are positioned in close permanent proximity to each other, the generally stronger reference layer may affect the orientation of the data layer. More specifically, the magnetization of the reference layer may generate a demagnetization field that extends sufficiently from the reference layer into the data layer.

The result of this demagnetization field from the reference layer is an offset in the coercive switching field. This offset can result in an asymmetry in the switching characteristics of the bit: the amount of switching field needed to switch the bit from parallel to anti-parallel state is different from the switching field needed to switch the bit from anti-parallel state to parallel state. To have reliable switching characteristics and to simplify the read/write circuitry, it is desirable to have this offset reduced to as near zero as possible.

The magnetoresistance $\Delta R/R$ may be described as akin to a signal-to-noise ratio S/N. A higher S/N results in a stronger signal that can be sensed to determine the state of the bit in the data layer. Thus, at least one disadvantage of a tunnel junction memory cell having a pinned reference layer in close and fixed proximity to the data layer is a potential reduction in the magnetoresistance $\Delta R/R$ resulting from the angular displacement.

To pin the reference layer during manufacturing, the reference layer must be heated to an elevated temperature in an annealing step. The annealing step typically takes time, perhaps an hour or more. As the reference layer is but one part of the memory being produced, the entire memory must be subject to temperatures ranging from about 200 to 300 degrees centigrade while under the influence of a constant and focused magnetic field. Such manufacturing stresses may permit the reference layer to become un-pinned and lose it's set orientation if the memory is later subjected to high temperatures. In addition, the characteristics of the data layer may be unknowingly affected by the annealing heat during some manufacturing processes.

To facilitate establishing a pinned reference layer it is not uncommon for the reference layer to include multiple layers of material. While utilizing multiple layers may help insure that the reference layer remains pinned, it also raises the complexity of manufacturing each and every memory cell present in the magnetic memory.

As computer manufacturers and code developers strive to achieve faster and more powerful systems and applications, the speed of access and total memory capacity of mass storage devices become focal points of concern. Advances in technology have greatly increased the storage capacity of mass storage devices such as hard drives. However generally speaking mass storage devices employ a system of physical movement to read and write data over high cost electronic access methods utilized in traditional main memory.

The physical movement component of a mass storage device directly affects the latency in accessing data. For example, the latency in access time with hard drives is a factor of: 1) moving the read head to the appropriate radial location over the spinning disk, and 2) waiting for the spinning disk to rotate sufficiently to place the desired data bit directly in line with the read head.

Because hard disks may rotate at several thousand revolutions per minute, precise tolerances in manufacturing must be maintained to ensure that read/write transport does not inadvertently contact the media storage surface and cause damage. In addition, the data bits provided upon the disk must be placed sufficiently apart from one another such that the magnetic read/write fields applied to one data bit do not inadvertently alter neighboring data bits. This issue of providing buffering space between magnetic data bits is common in many forms of magnetic storage as used in both main and mass storage devices.

The developer of the present invention, Hewlett-Packard, Inc., has been researching ultra-high-density mass storage devices with storage areas sized on the nanometer scale. One particular field of such nanometer mass storage devices is probe based storage. In such a system a physical probe is moved from one memory location to another to read/write data to a particular location.

With respect to magnetic memory components, it is well known that as size decreases coercivity increases. A large coercivity is generally undesirable as it requires a greater electrical field to be switched, which in turn requires a greater power source and potentially larger conductor. Providing large power sources and large conductors is generally at odds with the focus of nanotechnology to reduce the necessary size of components. In addition, to mitigate the potential of inadvertently switching a neighboring memory cell, nanometer scaled memory cells are generally more widely spaced relative to their overall size than are non-nanometer sized memory cells. Moreover, as the size of the magnetic memory decreases, the unused space between individual memory cells tends to increase.

Hence, in a nanotip magnetic memory array a significant amount of overall space may be used simply to provide a physical buffer between the cells. Absent this buffering space, or otherwise reducing it's ratio, a greater volume of storage in the same physical space could be obtained. In addition, the large currents and potentially large conductors impose physical stresses upon the design and implementation of nanotip probes.

Hence, there is a need for an ultra-high density nanotip memory array which overcomes one or more of the drawbacks identified above. The present invention satisfies one or more of these needs.

SUMMARY

This invention provides a nanotip magnetic memory array with thermally assisted switching.

In particular, and by way of example only, according to an embodiment of the present invention, this invention provides a magnetic memory storage device including: a plurality of ferromagnetic data layers characterized by an alterable orientation of magnetization, the data layers joined to at least one conductor; at least one soft reference layer joined as a distal tip to at movable probe, the movement relative to the plurality of data layers, the distal tip positioned within close proximity to a given data layer, the probe further including a probe conductor; and at least one intermediate layer forming a magnetic tunnel junction between the data layer and the positioned soft reference layer.

Moreover, according to an embodiment thereof, the invention may provide a magnetic memory storage device including: a plurality of memory cells, each memory cell including; at least one ferromagnetic data layer characterized by an alterable orientation of magnetization; a conductor in electrical contact with the data layer; at least one movable probe with a distal tip positioned within close proximity of a given memory cell, the probe including; a support; a conductor joined to the support and forming the distal tip; and a soft ferromagnetic reference layer proximate to the conductor, the layer having a non-pinned orientation of magnetization; and at least one intermediate layer forming a magnetic tunnel junction between the data layer of a given memory cell and the soft reference layer of the positioned tip.

In yet another embodiment, the invention may provide a thermal-assisted magnetic memory storage device including: a plurality of memory cells, each memory cell including; at least one ferromagnetic data layer characterized by an alterable orientation of magnetization, the ferromagnetic data layer including a material wherein the coercivity is decreased upon an increase in temperature; a conductor in electrical contact with the data layer, opposite the intermediate layer; at least one movable probe with a distal tip positioned within close proximity of a given memory cell, the probe including; a support; a conductor joined to the support and forming the distal tip; a heat generator joined to the support proximate to the conductor; and a soft ferromagnetic reference layer proximate to the conductor, the layer having a non-pinned orientation of magnetization; and at least one intermediate layer forming a magnetic tunnel junction between the data layer of a given memory cell and the soft reference layer of the positioned tip.

These and other objects, features and advantages of the preferred method and apparatus will become apparent from the following detailed description, taken in conjunction with the accompanying drawings which illustrate, by way of example the principles of the invention.

BRIEF DESCRIPTION OF THE DRAWINGS

FIG. 5 is a side view illustrating an alternative write operation of the memory shown in FIG. 1B.

DETAILED DESCRIPTION

Before proceeding with the detailed description, it is to be appreciated that the present invention is not limited to use or application with a specific type of magnetic memory. Thus, although the present invention is, for the convenience of explanation, depicted described with respect to typical exemplary embodiments, it will be appreciated that this invention may be applied with other types of magnetic memory.

Figure 1A:
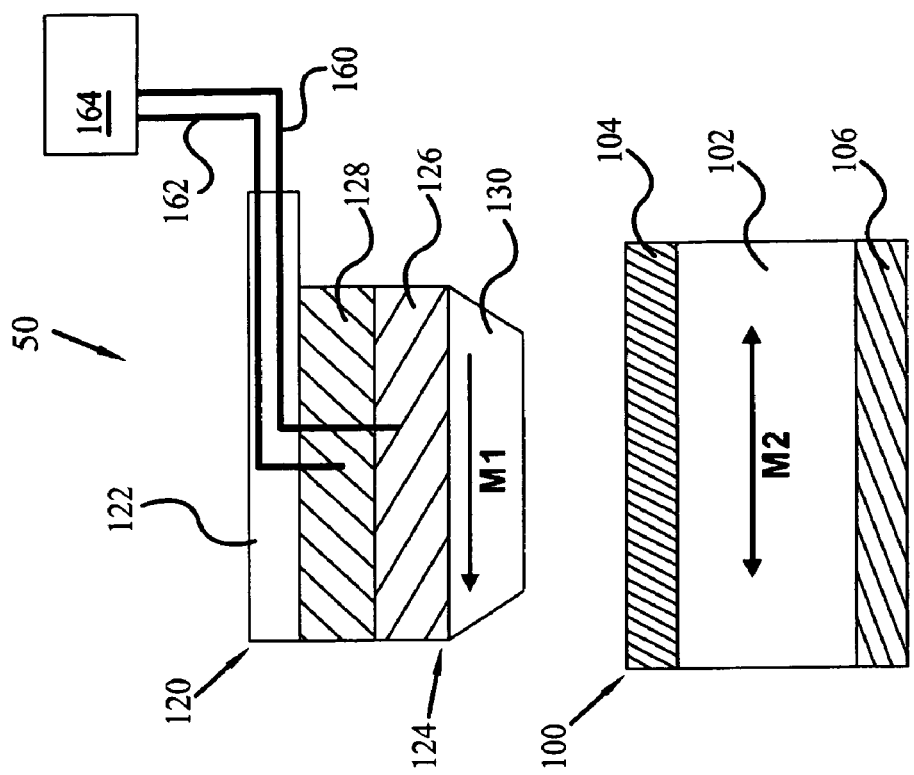
FIGS. 1A, 1B, 1C, and 1D show a portion of an exemplary magnetic memory embodying the present invention.
Figure 1B:
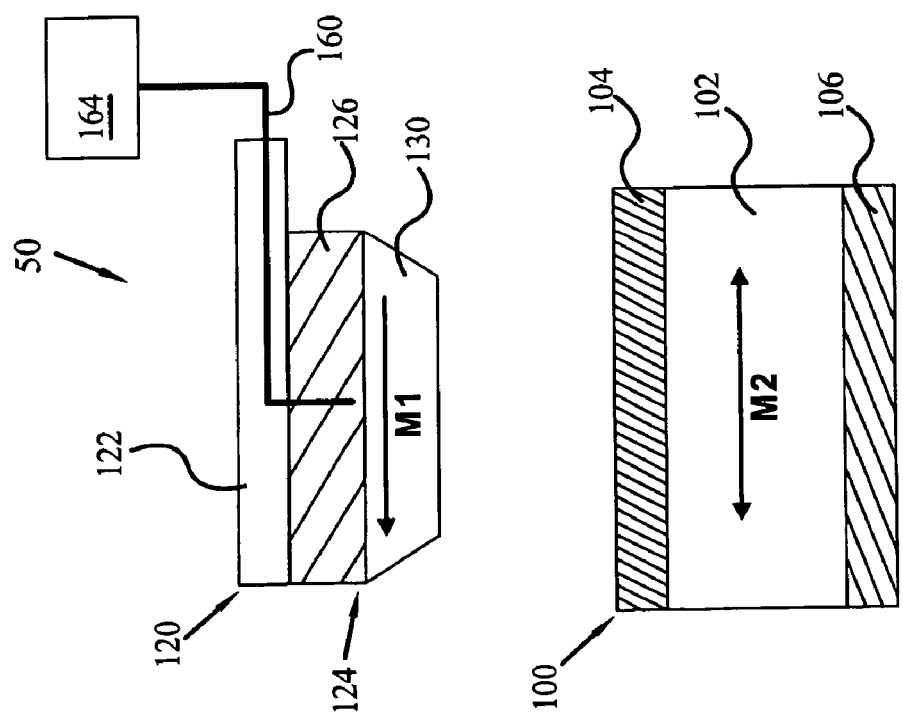
Figure 1D:
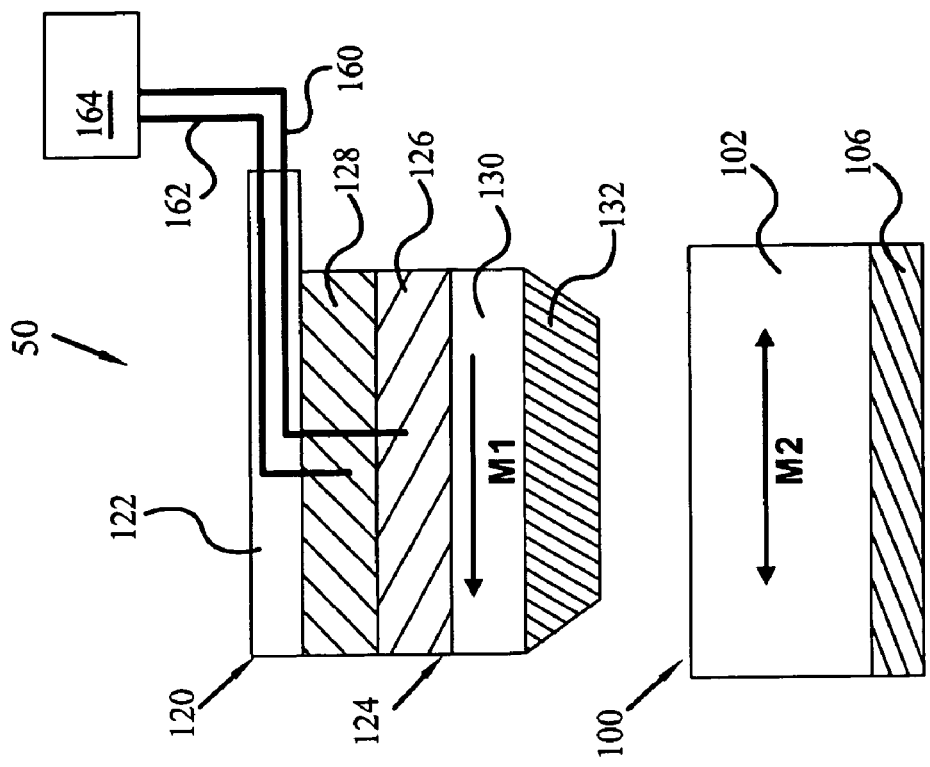
Figure 1C:
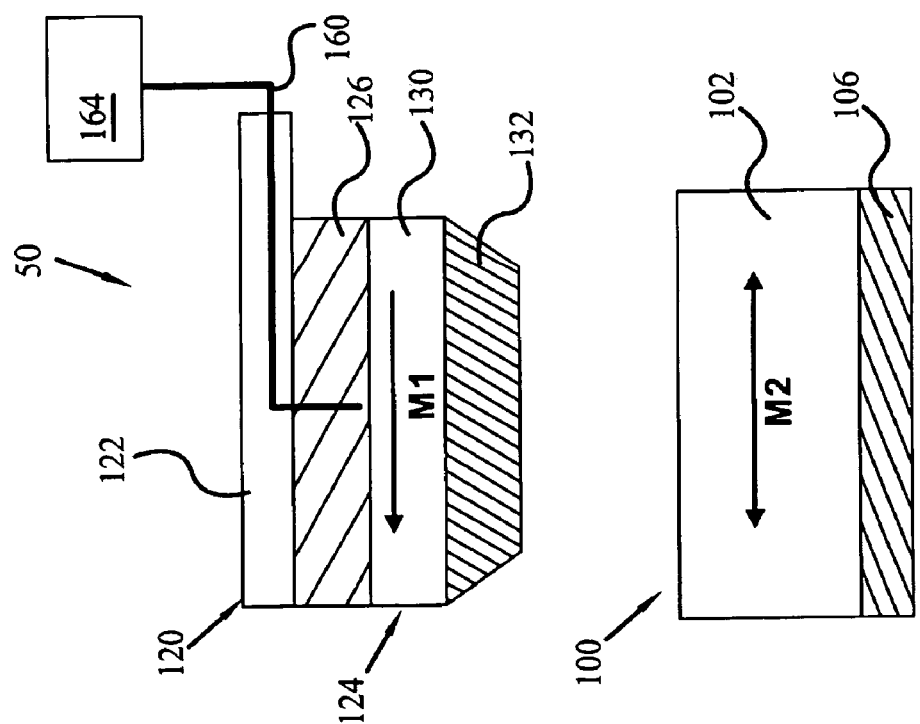

Referring now to the drawings, and more particularly to FIGS. 1A and 1B, there is shown a portion of a nanotip based magnetic memory with thermally assisted switching 50, having at least one magnetic memory cell 100 and movable probe 120 positioned proximate to the memory cell 100, according to an embodiment of the present invention. In at least one embodiment, the magnetic memory cell 100 may be a divided magnetic tunnel junction memory cell. Specifically, the magnetic memory cell 100 may have a ferromagnetic data layer 102, a intermediate layer 104 and a conductor 106 in electrical contact with the data layer 102.

The ferromagnetic data layer 102 permits the storing of a bit of data as an alterable orientation of magnetization M2. The intermediate layer 104 is joined to the data layer 102, and as shown may extend across the data layer 102, such that the movable probe 120 will not physically contact the data layer 102 directly. The conductor 106 is in electrical contact with the data layer 102, opposite the intermediate layer 104. In at least one embodiment the data layer 102 may consist of a material wherein the coercivity is decreased upon an increase in temperature.

The movable probe 120 has an articulating support 122 and a distal tip 124 that may be positioned within close proximity of a given memory cell 100. As shown in FIG. 1A, in at least one embodiment, the probe's distal tip 124 is characterized by a conductor 126 and a soft ferromagnetic reference layer 130. In an alternative embodiment, the distal tip 124 may further include a heat generator 128, as shown in FIG. 1B. For the ease of discussion the conductor 126 and heat generator 128 have been illustrated separately. It us understood and appreciated that the conductor 126 and heat generator 128 may be integrated as one and the same. As alternatives to FIGS. 1A and 1B, FIGS. 1C and 1D illustrate embodiments wherein an alternative intermediate layer 132 is joined to the soft reference layer 130 of the probe 120 rather than the data layer 102 of the memory cell 100. Under appropriate circumstances separate intermediate layers 132 and 104 may both be provided.

The conductor 126 may form the distal tip 124. The tip 124 of probe 120 is sized to be substantially about the same size or smaller than the diameter of a given memory cell 100. As the conductor 126 is utilized to perform read operations, it may be generally be referred to as a read conductor. As is conceptually shown, the tip may be conical, such that it is smaller proximate to the memory cell 100. Although one nanotip probe 120 is shown, under appropriate circumstances an array of movable nanotip probes may be provided and supported above an array of the memory cells 100.

The soft reference layer 130 is so named because the direction of orientation of magnetization M1 can be dynamically set to a known direction by an externally supplied current flowing through the probe conductor 126. It is termed "soft" because it generally comprises materials that are magnetically soft and are not of the usual hard-pinned materials used for more traditional pinned reference layers. As the reference layer 130 is not in close permanent proximity to the data layer 102, the potential angular displacement caused by the demagnetization field of reference layer is significantly avoided and the magnetoresistance ΔR/R may be optimally maintained.

Together, the components of the distal tip 124 (the conductor 126 and soft reference layer 130) and the memory cell 100 (the conductor 106, data layer 102, and cap 104 or 132) form the components of a tunnel junction memory cell. Specifically, when the distal tip 124 is brought into contact with the cap 104, the cap 104 acts as the tunnel junction between the reference layer 130 and the data layer 102. Where the cap 132 is part of the distal tip 124, the cap 132 again acts as the tunnel junction between the reference layer 130 and the data layer 102 when the distal tip 124 contacts the data layer 102 of a given memory cell 100. In other words, a magnetic tunnel junction is formed when the data layer 102, the intermediate layer (the intermediate layer 104 or 132), and the soft reference layer 130 are brought together. Such an assembly occurs when the probe 120 is positioned proximate to a given memory cell 100 so as to permit electrical and or thermal contact between the probe 120 and the given memory cell 100. A magnetic tunnel junction is not formed until such proximate positioning occurs.

In at least one embodiment, the ferromagnetic data layer 102 has a lower coercivity then the soft reference layer 130. The ferromagnetic data layer 102 may be made from a material that includes, but it not limited to: Nickel Iron (NiFe), Nickel Iron Cobalt (NiFeCo), Cobalt Iron (CoFe), and alloys of such metals.

The nanotip probe 120 is movable and as such can be moved from a location proximate to one memory cell 100 to a location proximate to another memory cell, such as the memory cell 100'. Specifically, the probe may be positioned along the X and Y coordinate axis above a given memory cell 100. The probe may then be positioned along the Z coordinate axis to permit the transfer of electrical current and heat energy between the nanotip probe 120 and a given memory cell 100. The heat energy may be transferred conductively, radiantly, or via a combination of both. In general, the X and Y movement to align with a specific memory cell 100 will occur before movement along the Z axis.

The movement articulation of nanotip probe 120 may be achieved by components that one skilled in the art of probe based storage would know to use in order to position a nanotip probe, or array of probes, above the memory cells 100. In at least one embodiment the movement articulation may be accomplished with the use of electrostatic, piezoelectric, or a combination of electrostatic and piezoelectric positioners such as have been achieved using current MEMS (micro electro mechanical system) devices.

Electrical connections, shown as wire(s) 160 in FIG. 1A and wire(s) 162 in FIG. 1B, connect the conductor 106 and the heat generator 128 to a power source 164. The power source permits the nanotip probe 120 to provide a localized current, and under appropriate circumstances a localized heat, to a specifically designated memory cell 100. In at least one embodiment, the heat generator 128 may be a planar resistor, a current carrying coil or other such device capable of providing a localized heat source. The conductor 126 of the probe 120 may be made from an electrically conductive material. Suitable materials for the conductor 126 may include, but are not limited to: Copper (Cu), Aluminum (Al), Aluminum Copper (AlCu), Gold (Au), Silver (Ag), and alloys of such metals.

Figure 2:
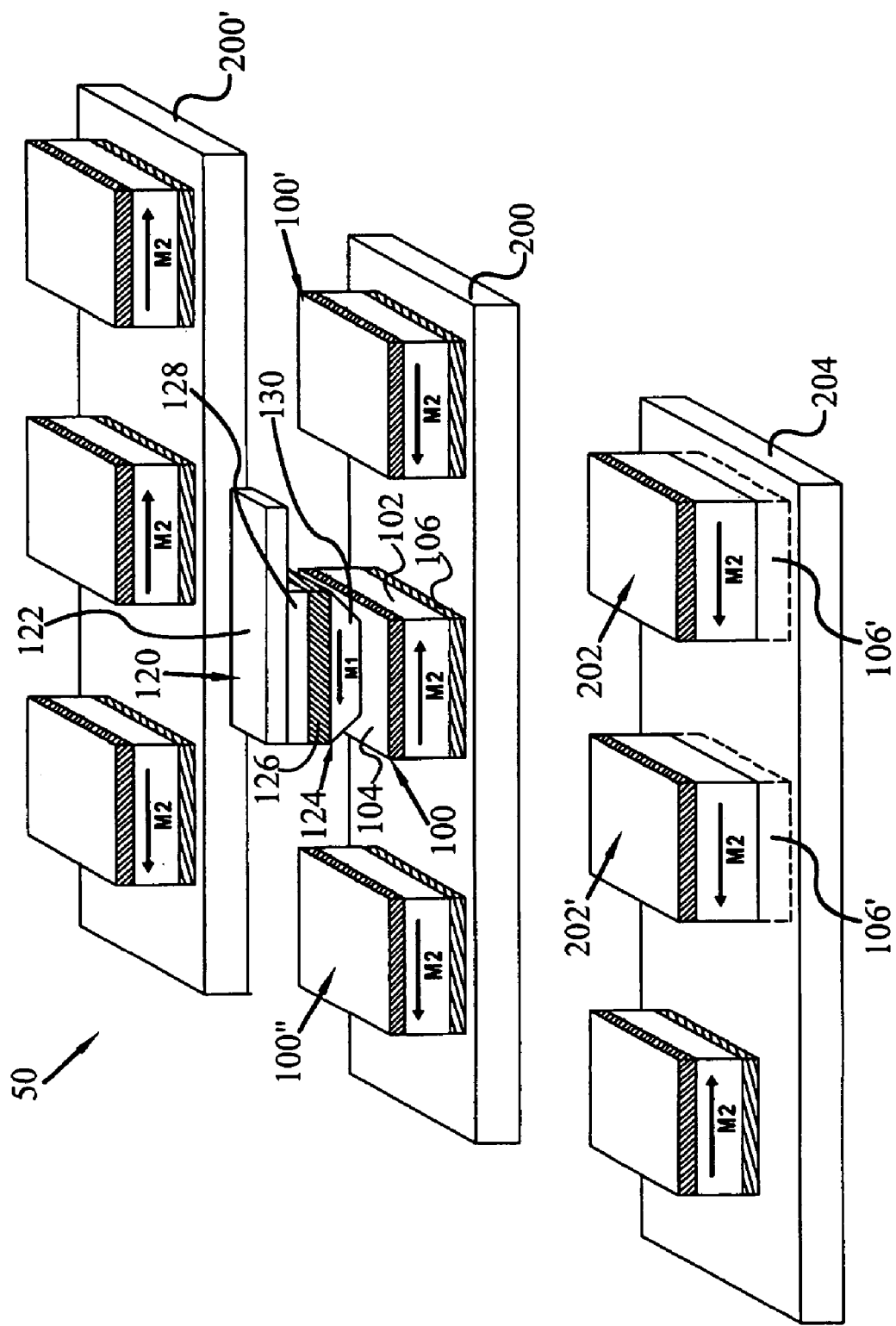
FIG. 2 is a perspective view of an array of memory cells as shown in FIG. 1.

As noted above, the magnetic memory 50 may have a plurality of memory cells 100 set out in an array. Each memory cell may have it's own conductor 106, which may be in contact with a row conductor 200, common to memory cells 100, 100' and 100" in a given row of the array as shown in FIG. 2. The conductor 106 of memory cell 100 may be joined to the common conductor 200, or as with memory cells 202 and 202', the conductor 106' may be an integral part of the common conductor 204. In at least one embodiment, the conductor 106 is common to a subset of the plurality of memory cells. Under appropriate circumstances the subset may include the entire plurality of memory cells present in the array. In an alternative embodiment employing multiple probes 120, the cell conductor 106 may be a common conductor common to all memory cells accessible by a given probe 120. In yet another embodiment, the array of memory cells 100 may be movable, achieved as described above with respect to the probe 120. The movement of the memory cells 100 may combine in harmony with the movement of the probe 120 or probes to further improve the relative speed of access to any particular memory cell 100. Under appropriate circumstances, the relative movement of the probe 120 or probes may be accomplished entirely by movement of the memory cells 100. With respect to embodiments providing multiple probes 120, the probes 120 may be moved in tandem along the X, Y and Z axes, or individually along one or more of the axes.

With respect to FIG. 2 the description of memory cells 100 as divided magnetic tunnel junction memory cells can be more fully appreciated. As noted above, when the probe 120 is directed to a given memory cell 100, the combined components of the memory cell 100 and the probe 120 permit the data bit recorded in cell 100 to be read or written. As each memory cell 100 generally provides a data layer and a intermediate layer to serve as a tunnel layer, the manufacturing tasks to provide an array of cells 100 are advantageously simplified. For example, as memory cells 100 do not include a reference layer, the prolonged heat and magnetic fields of annealing may be avoided.

The phenomenon that causes the resistance in magnetic tunnel junction memory cell 100 is well understood in the magnetic memory art and is well understood for TMR memory cells. GMR and CMR memory cells have similar magnetic behavior but their magnetoresistance arises from different physical effects as the electrical conduction mechanisms are different. For instance, in a TMR-based memory cell, the phenomenon is referred to as quantum-mechanical tunneling or spin-dependent tunneling. In a TMR memory cell, the intermediate layer 104 is a thin barrier of dielectric material through which electrons quantum mechanically tunnel between the data layer 102 and the soft reference layer 130.

In a GMR memory cell, the intermediate layer 104 is a thin spacer layer of non-magnetic but conducting material. Here the conduction is a spin-dependent scattering of electrons passing between the data layer 102 and the soft reference layer 130 though the intermediate layer 104. In either case, the resistance between the data layer 102 and the soft reference layer 130 will increase or decrease depending on the relative orientations of the magnetic fields M1 and M2. It is that difference in resistance that is sensed to determine if the data layer 102 is storing a logic state of "0" or a logic state of "1".

In at least one embodiment, the intermediate layer 104 is a tunnel layer made from an electrically insulating material (a dielectric) that separates and electrically isolates the data layer 102 from the pinned reference layer 130. Suitable dielectric materials for the dielectric intermediate layer 104 may include, but are not limited to: Silicon Oxide ($SiO_2$), Magnesium Oxide (MgO), Silicon Nitride ($SiN_x$), Aluminum Oxide ($Al_2O_3$), Aluminum Nitride ($AlN_x$), and Tantalum Oxide ($TaO_x$).

In at least one other embodiment, the intermediate layer 104 is a tunnel layer made from a non-magnetic material such as a 3d, a 4d, or a 5d transition metal listed in the periodic table of the elements. Suitable non-magnetic materials for a non-magnetic intermediate layer 104 may include, but are not limited to: Copper (Cu), Gold (Au) and Silver (Ag). While the actual thickness of the intermediate layer 104 is dependent upon the materials selected to create the intermediate layer 104 and the type of tunnel memory cell desired, in general, the intermediate layer 104 may have a thickness of about 0.5 nm to about 5.0 nm.

As stated, the nanotip probe 120 may be moved to a position substantially proximate to memory cell 100. Depending upon the intermediate layer 104 being either dielectric or conductive material, the proximate location may be pressure contact or electrical contact between the distal tip 124 and the memory cell 100. In at least one embodiment, the distal tip 124 is brought into physical contact with the memory cell 100.

The bit of data stored in the data layer 102 can be read during a read operation performed upon the magnetic memory cell 100 by passing the read current $I_R$ through the conductor 126 of the nanotip probe 120 in physical contact with memory cell 100 and then measuring the resistance between the data layer 102 and the soft reference layer 130. The logical state of the bit as a "1" or a "0" can be determined by sensing the magnitude of the resistance.

Figure 3:
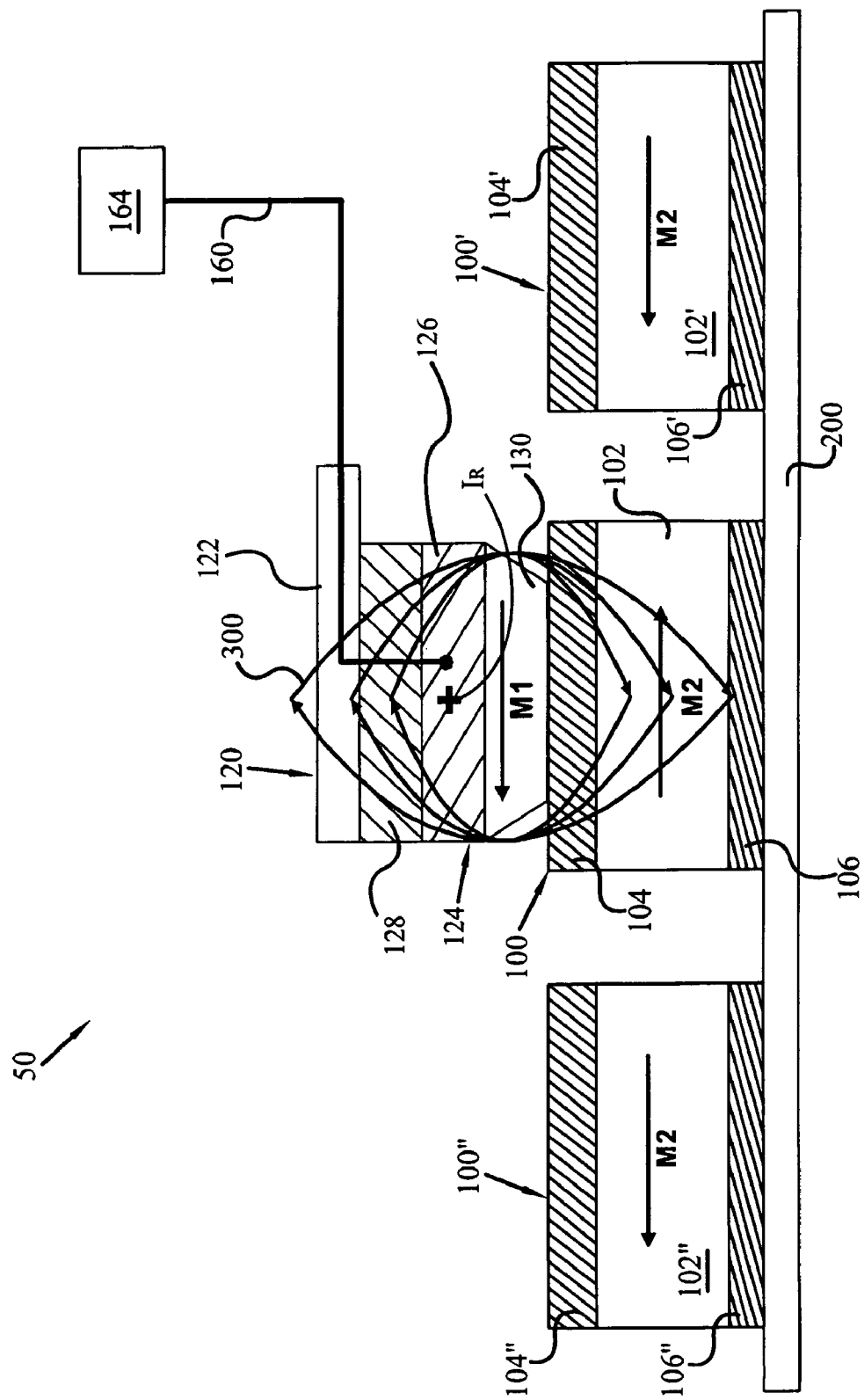
FIG. 3 is a side view illustrating the read operation of the memory shown in FIG. 1.

Shown in FIG. 3, an externally supplied read current $I_R$ of a predetermined magnitude and direction is supplied by wires 160 and passed through the conductor 126 resulting in the generation of a magnetic field. As introduced above, the magnetic field M1 of the soft reference layer 130 is pinned on the fly to a know orientation. As long as the read current $I_R$ is flowing, a resistance exists between the ferromagnetic data layer 102 and the soft ferromagnetic reference layer 130 due to the flow of electrons between the data layer 102 and the reference layer 130 through the intermediate layer 104. By measuring the magnitude and/or change in that resistance the state of the data bit stored in the data layer 102 can be determined.

Because the orientation of M1 is not pinned, a convention is generally adopted as to which way M1 will be oriented. For example, the conceptual arrangement in FIG. 3 may illustrate such a convention. As shown the read current $I_R$ is flowing into the page, indicated by the "+" symbol, such that the magnetic field (represented by curved arrows 300) has a vector in the clockwise direction in accordance with the right-hand rule. The pinned on the fly orientation of M1 is therefore towards the left. Further, the convention may be refined to state that a logic state of "0" exists where M1 and M2 are parallel, and a logic state of "1" exists where M1 and M2 are anti-parallel, comparisons determined by resistance.

To summarize, a read operation is performed upon memory cell 100 when the probe 120, and more specifically the distal tip 124, is moved to contact a given memory cell 100. A read current $I_R$ is provided from the remote power source 164 to the conductor 126 by wire 160. The current flowing through the conductor may be used to generate a magnetic field 300 that is sufficient to establish a pinned on the fly orientation of M1 in the soft reference layer 130. The resistance of the current flowing through the memory cell 100 is measured and the value of the data bit stored as M2 is deduced. For the purposes of a read operation, the presence or absence of the heat generator 128 in the distal tip 124 is generally of little consequence.

The magnetic field 300 is not sufficient to overcome the coercivity of the unheated data layer 102 of the given magnetic cell 100. As such the alterable nature of the magnetic field M2 of the data layer 102 is substantially unchanged. As probe 120 is in preferably in contact only with a given magnetic cell 100, it is unlikely that the magnetic field 300 will adversely affect the data layers 102', 102" of the adjacent memory cells 100', 100" which are further removed from the influence of magnetic field 300 by their physical placement and lack of contact with probe 120. In addition, although the orientation of M1 of the soft reference layer 130 may be pinned on the fly, M1 generally will not remain pinned when magnetic field 300 is removed by the cessation of current.

It is generally appreciated in the magnetic memory arts that as the size of a magnetic bit decreases, the coercivity of the bit will increase. For example, a 0.2×0.3 nanometer bit may have a coercivity of about 40 Oe [1 Oe=1000/(4*pi) A/m], whereas a 0.8×0.16 nanometer bit may have a coercivity of about 100 Oe [1 Oe=1000/(4*pi) A/m]. In general, the coercivity of a material will decrease as temperature increases. For example a 100 Celsius degree rise in temperature may impart a drop in coercivity by about 50%. Upon a decrease in temperature to the original state, the original coercivity will generally return.

Figure 4:
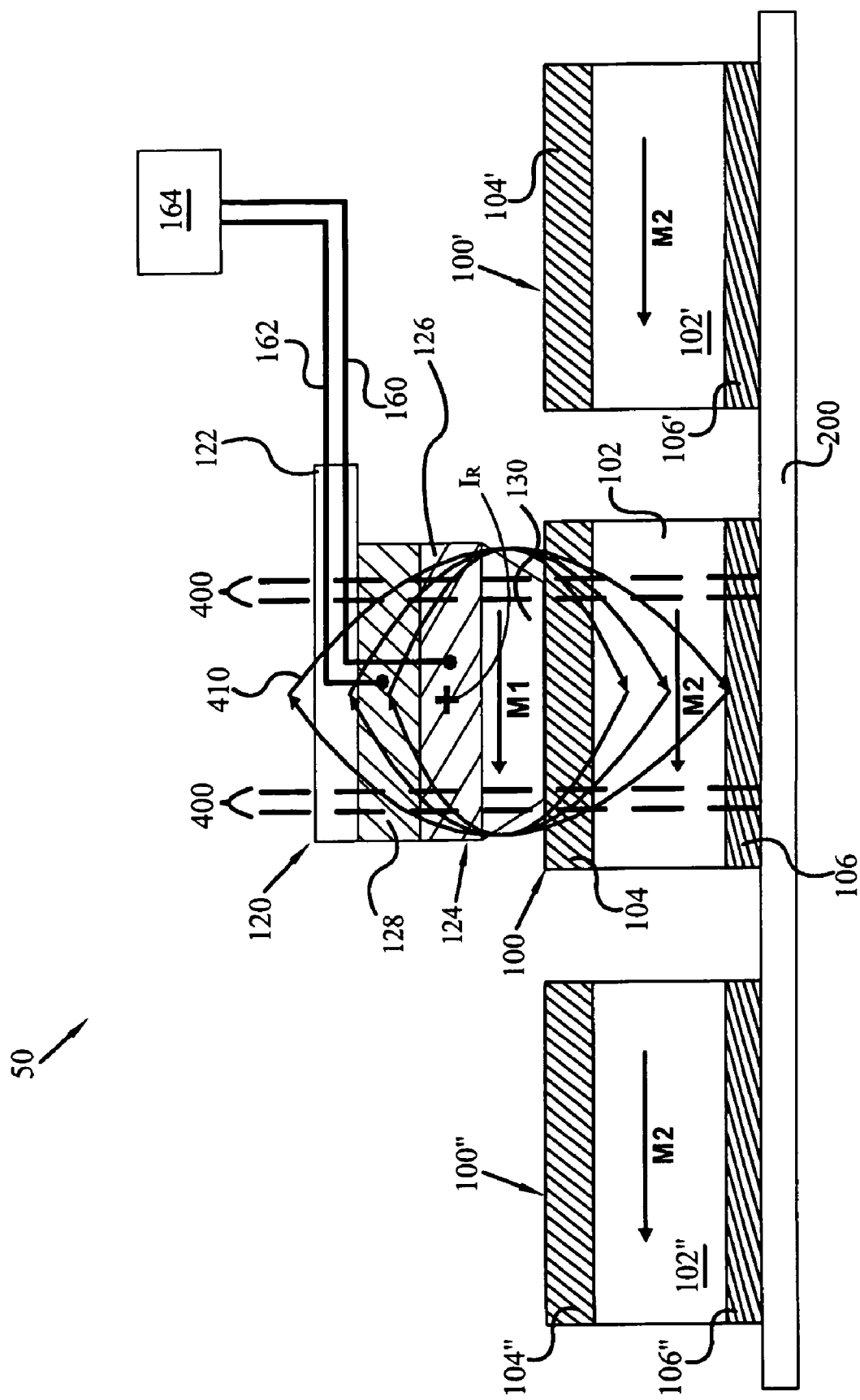
FIG. 4 is a side view illustrating the write operation of the memory shown in FIG. 1A.

The ability of the memory 50 to store data is exemplified in FIGS. 4 and 5. In at least one embodiment, the distal tip includes a heat generator 128 and the data layer 102 is characterized by a material wherein the coercivity is decreased upon an increase in temperature. Such an embodiment is conceptually illustrated in FIG. 4. An externally supplied current may be supplied by wires 162 to heat generator 128 resulting in the generation of heat represented by dashed lines 400. The heat 400 may be directed into the given memory cell 100. An externally supplied current IR of a predetermined magnitude and direction is supplied by wires 160 and passed through the conductor 126 resulting in the generation of a magnetic field. The current IR is flowing into the page as indicated by the "+" symbol such that the magnetic field has a vector in the clockwise direction in accordance with the right-hand rule (represented by curved arrows 410). The supplied current may be of substantially the same predetermined magnitude as used in the determination of the data bit based on the sensing of resistance described above. Under appropriate circumstances, the sensing of resistance to read a data bit may be performed substantially concurrently with the heating process to achieve the storage of a data bit.

Akin to the description of magnetic field 300 shown in FIG. 3, the magnetic field 410 of FIG. 4 is unlikely to adversely affect the data layers 102', 102" of the adjacent memory cells 100', 100" which are further removed from the influence of the magnetic field 410 by their physical placement and lack of contact with probe 120. As heat 400 has elevated the temperature of the data layer 102, the coercivity of data layer 102 is decreased. Whereas magnetic field 410 is unable to alter the nature of the magnetic field M2 of the data layer 102 in it's unheated state, the magnetic field 410 is sufficient to alter the magnetic field M2 of the data layer 102 in it's heated state. As the vector of the magnetic field 410 is to the left, M2 will be aligned to point to the left. It is to be appreciated that the relative field strengths of magnetic read fields 300 and 410 are substantially equal as they are generated by the same read conductor 126 operating with substantially the same current. In addition, although the orientation of the soft reference layer 130 may be pinned on the fly, in at least one embodiment the coercivity of the ferromagnetic material comprising the soft reference layer 130 is greater than the magnetic field 410, even when reference layer 130 is heated.

In further example, if the direction of current is reversed in read conductor 126, the resultant magnetic field will have a vector in the counter clockwise direction. When heat 400 is present to sufficiently elevate the temperature of data layer 102 and thereby reduce the coercivity, the counter clockwise vector of magnetic field will align M2 to point to the right.

Moreover, the magnetic field 410 as generated by a read current is sufficient to overcome the coercivity of heated data layer 102. As the magnetic read field 410 may overcome the coercivity of the data layer 102, the orientation of the magnetization M2 may be altered from one orientation to another. In at least one embodiment, the change in orientation performed upon the heated data layer 102 does not affect the orientation of the adjacent non-heated data layers 102', 102".

As an advantages result, in at least one embodiment, the bit to bit pitch of the memory cells 100 (distance between the center points of each cell) may be decreased. Such shortening of bit to bit pitch is advantageous as it permits a greater density of memory cells in a given space, and therefore greater memory capacity. In addition, as the magnetic fields 300, 410 generated by the probe conductor 126 are substantially the same for a read or write operation, manufacturing and design issues are simplified.

In yet another embodiment, illustrated in FIG. 5, the write operation may be accomplished without the use of the heat generator 128. Here, an externally supplied current $I_R$ of a predetermined magnitude and direction is supplied by wires 160 and passed through the conductor 126 resulting in the generation of a magnetic field. The current $I_R$ is flowing into the page as indicated by the "+" symbol such that the magnetic field has a vector in the clockwise direction in accordance with the right-hand rule (represented by curved arrows 500). The supplied current may be of substantially the same predetermined magnitude as used in the determination of the data bit based on the sensing of resistance described above. Under appropriate circumstances, the sensing of resistance to read a data bit may be performed substantially concurrently with the write to confirm the storage of a data bit.

To provide a magnetic field sufficiently greater than the coercivity of the data layer 102, an additional current may be applied to the cell conductor 106 by common conductor 200. The current $I_R$ is flowing out of the page as indicated by the "−" symbol such that the magnetic field has a vector in the counter-clockwise direction in accordance with the right-hand rule (represented by curved arrows 510). As is shown, the fields 500 and 510 overlap substantially proximate to the data layer 102. Their combined magnitude is sufficient to overcome the coercivity of the data layer 102.

Akin to the description of magnetic field 300 shown in FIG. 3, the magnetic field 500 of FIG. 5 is unlikely to adversely affect the data layers 102', 102" of the adjacent memory cells 100', 100" which are further removed from the influence of the magnetic field 500 by their physical placement and lack of contact with probe 120. The same is true of field 510. Although a current provided along common conductor 200 may be provided to other memory cells located on the common conductor, any resulting field is insufficient by itself to adversely affect another data layer. As the vector of the combined magnetic field 500 and 510 is to the left, M2 will be aligned to point to the left. It is to be appreciated that the relative field strengths of magnetic read fields 300 and 500 are substantially equal as they are generated by the same read conductor 126 operating with substantially the same current. In addition, although the orientation of the soft reference layer 130 may be pinned on the fly, in at least one embodiment the coercivity of the ferromagnetic material comprising the soft reference layer 130 is greater than the combined magnetic fields 500 and 510.

In further example, if the direction of current is reversed in the probe conductor 126 and reversed in the cell conductor 106, the resultant magnetic field will have a vector in the counter clockwise direction. As such the counter clockwise vector of the combined magnetic field will align M2 to point to the right. Under appropriate circumstances the use of a heat generator 128 may be combined with the use of converging magnetic field to further lower the coercivity of the data layer 102 and potentially quicken the re-orientation operation.

Moreover, the magnetic field 500 as generated by a read current is sufficient to overcome the coercivity of heated data layer 102. As the magnetic read field 500 may overcome the coercivity of the data layer 102, the orientation of the magnetization M2 may be altered from one orientation to another. In at least one embodiment, the change in orientation performed upon the heated data layer 102 does not affect the orientation of the adjacent non-heated data layers 102', 102".

Advantageously, the bit to bit pitch of the memory cells 100 may be decreased, permitting a greater density of memory cells in a given space, and therefore greater memory capacity. In addition, as the magnetic fields 300, 500 generated by the probe conductor 126 are substantially the same for a read or write operation, manufacturing and design issues are simplified.

In at least one embodiment, the ferromagnetic data layer 102 has a lower coercivity then the soft reference layer 130. The ferromagnetic data layer 102 comprising a material wherein the coercivity is decreased upon an increase in temperature may be made from a material that includes, but it not limited to: Nickel Iron (NiFe), Nickel Iron Cobalt (NiFeCo), Cobalt Iron (CoFe), and alloys of such metals.

The conductor 126 of the probe 120 may be made from an electrically conductive material. Suitable materials for the conductor 126 may include, but are not limited to: Copper (Cu), Aluminum (Al), Aluminum Copper (AlCu), Gold (Au), Silver (Ag), and alloys of such metals.

Having described the above physical embodiment of the magnetic memory 50, another embodiment may be appreciated to be a computer system incorporating the magnetic memory 50. As has been described above, the physical size of magnetic memory 50 is quite small, thereby permitting a greater volume of storage in the same physical space over contemporary memory devices. Further, the movement of the probe 120 is over very small distances permitting quick access times and reduced latency. A computer with a main board, CPU and at least one memory store comprised of magnetic memory 50 is advantageously fast.

While the invention has been described with reference to the preferred embodiment, it will be understood by those skilled in the art that various alterations, changes and improvements may be made and equivalents may be substituted for the elements thereof and steps thereof without departing from the scope of the present invention. In addition, many modifications may be made to adapt to a particular situation or material to the teachings of the invention without departing from the essential scope thereof. Such alterations, changes, modifications, and improvements, though not expressly described above, are nevertheless intended and implied to be within the scope and spirit of the invention. Therefore, it is intended that the invention not be limited to the particular embodiments disclosed as the best mode contemplated for carrying out this invention, but that the invention will include all embodiments falling within the scope of the appended claims.

I claim:

1. A thermal-assisted magnetic memory storage device comprising:
   a plurality of memory cells, each memory cell including;
      at least one ferromagnetic data layer characterized by an alterable orientation of magnetization, the ferromagnetic data layer comprising a material wherein the coercivity is decreased upon an increase in temperature;
      a first conductor in electrical contact with the data layer;
   at least one movable probe with a distal tip positioned within close proximity of a given memory cell, the probe including;
      a support;
      a second conductor joined to the support and forming the distal tip;
      a heat generator joined to the support proximate to the probe second conductor; and
      a soft ferromagnetic reference layer proximate to the probe second conductor, the layer having a non-pinned orientation of magnetization; and
   at least one intermediate layer forming a magnetic tunnel-junction between the data layer of a given memory cell and the soft reference layer of the positioned tip.

2. The magnetic memory storage device of claim 1, wherein the intermediate layer is joined to the soft reference layer of the distal tip.

3. The magnetic memory storage device of claim 1, wherein an intermediate layer is joined to each data layer opposite from each first conductor.

4. The magnetic memory storage device of claim 1, wherein the second conductor of the probe and the heat generator are substantially one and the same component.

5. The thermal-assisted magnetic memory storage device of claim 1, wherein during a write operation the probe is moved to thermally influence a given memory cell;
   wherein the given memory cell is warmed by heat generated by the heat generator of the probe;
   wherein a current is provide to flow through the second conductor of the probe;
   wherein a magnetic field is generated by the current flowing through the second conductor of the probe; and
   wherein the orientation of magnetization of the data layer may be changed, the magnetic field of the second conductor of the probe being greater than the coercivity of the warmed data layer.

6. The thermal-assisted magnetic memory storage device of claim 1, wherein during a read operation the probe is moved to contact a given memory cell;

wherein a current is provide to flow through the second conductor of the probe;

wherein a magnetic field is generated by the current flowing through the second conductor of the probe; and wherein the soft ferromagnetic reference layer of the probe is pinned-on-the fly to a desired orientation by the magnetic field; and wherein the resistance of the current flowing through the given cell from the second conductor of the probe to the conductor of the given memory cell is measured.

7. The thermal-assisted magnetic memory storage device of claim 6, wherein the current flowing through the probe for a read operation is substantially the same as the current flowing through the probe for a write operation.

8. The thermal-assisted magnetic memory storage device of claim 6, wherein the magnetic field generated by the second conductor of the probe is less than the coercivity of the unheated data layer of the given memory cell.

9. The thermal-assisted magnetic memory storage device of claim 1, wherein the tip of the probe is sized to be substantially about the same diameter or smaller than the diameter of a given memory cell.

10. The thermal-assisted magnetic memory storage device of claim 1, wherein the first conductor of a memory cell is common to a subset of the plurality of memory cells.

11. The thermal-assisted magnetic memory storage device of claim 1, wherein the plurality of memory cells are arranged as an array.

12. The thermal-assisted magnetic memory storage device of claim 11, wherein the array is subdivided into at least two fields, each field of memory cells receiving one of the movable probes.

13. The thermal-assisted magnetic memory storage device of claim 1, having multiple movable probes, wherein the multiple probes move in tandem along the X, Y and Z axes.

14. The thermal-assisted magnetic memory storage device of claim 1, wherein the multiple probes move individually along one or more of the X, Y and Z axes.

15. The thermal-assisted magnetic memory storage device of claim 1, wherein movement of the probe permits electrical contact between the tip and a given memory cell.

16. The thermal-assisted magnetic memory storage device of claim 1, wherein movement of the probe permits pressure contact between the tip and a given memory cell.

17. The thermal-assisted magnetic memory storage device of claim 1, wherein the second conductor of the movable probe is an electrically conductive material.

18. The thermal-assisted magnetic memory storage device of claim 1, wherein the heat generator of the movable probe is a planar resistor or a current carrying coil.

19. The thermal-assisted magnetic memory storage device of claim 1, wherein the intermediate layer is a tunnel layer.

20. The thermal-assisted magnetic memory storage device of claim 19, wherein the tunnel layer is a dielectric material.

21. The thermal-assisted magnetic memory storage device of claim 20, wherein the dielectric material is a material selected from the group consisting of Silicon Oxide, Magnesium Oxide, Silicon Nitride, Aluminum Oxide, Aluminum Nitride, and Tantalum Oxide.

22. The thermal-assisted magnetic memory storage device of claim 19, wherein the tunnel layer is a spacer layer made from a non-magnetic material selected from the group consisting of a 3d, a 4d, and a 5d transition metal.

23. The thermal-assisted magnetic memory storage device of claim 22, wherein the non-magnetic material is a material selected from the group consisting of copper, gold, and silver.

* * * * *